(12) United States Patent
Suh et al.

(10) Patent No.: US 7,656,238 B2
(45) Date of Patent: Feb. 2, 2010

(54) FREQUENCY SYNTHESIZING APPARATUS AND METHOD HAVING INJECTION-LOCKED QUADRATURE VCO IN RF TRANSCEIVER

(75) Inventors: Chun Deok Suh, Yongin-si (KR); Jeong Wook Koh, Seoul (KR); Hoon Tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 584 days.

(21) Appl. No.: 11/447,887

(22) Filed: Jun. 7, 2006

(65) Prior Publication Data
US 2007/0159259 A1    Jul. 12, 2007

(30) Foreign Application Priority Data
Jan. 6, 2006    (KR) .................. 10-2006-0001861

(51) Int. Cl.
*H03B 21/01* (2006.01)
*H03L 7/00* (2006.01)

(52) U.S. Cl. .......................................... 331/41; 331/40

(58) Field of Classification Search .................. 331/41, 331/40, 54; 455/313
See application file for complete search history.

(56) References Cited

U.S. PATENT DOCUMENTS 5,343,168 A    8/1994    Guthrie 6,175,285 B1 *    1/2001    Gabara .................... 331/117 R
6,960,962 B2 *    11/2005    Peterzell et al. ............... 331/40

FOREIGN PATENT DOCUMENTS

| JP | 57-125528 A | 8/1982 |
|---|---|---|
| KR | 10-2002-0006155 A | 1/2002 |
| KR | 10-2005-0008463 A | 1/2005 |
| KR | 10-2005-0008464 A | 1/2005 |

\* cited by examiner

*Primary Examiner*—Joseph Chang
(74) *Attorney, Agent, or Firm*—Sughrue Mion, PLLC (57) ABSTRACT

A frequency synthesizing apparatus and method having an injection-locked quadrature VCO in an RF transceiver is provided. In the frequency synthesizer, an I signal following a frequency of a high frequency signal that is input using the injection-locked quadrature VCO and a Q signal thereof are simultaneously generated to have an appropriate driving power. Accordingly, the I signal and the Q signal thereof that are generated in the injection-locked quadrature VCO may be utilized as a local signal for frequency up/down-conversion, without being buffered. An output of an SSB mixer may be directly input into the injection-locked quadrature VCO. Also, high frequency signals that are generated in another circuit such as the SSB mixer, a PLL, or a VCO may be selected to be input into the injection-locked quadrature VCO by a selector.

15 Claims, 5 Drawing Sheets

FREQUENCY SYNTHESIZING APPARATUS AND METHOD HAVING INJECTION-LOCKED QUADRATURE VCO IN RF TRANSCEIVER

CROSS-REFERENCE TO RELATED APPLICATION

This application claims the benefit of Korean Patent Application No. 10-2006-0001861, filed on Jan. 6, 2006, in the Korean Intellectual Property Office, the disclosure of which is incorporated herein by reference.

BACKGROUND OF THE INVENTION

1. Field of the Invention

The present invention relates to a frequency synthesizing apparatus for a radio frequency (RF) transceiver, and more particularly, to a frequency synthesizing apparatus and method which can reduce a circuit area and may be low powered, and also can reduce signal distortion.

2. Description of Related Art

A frequency synthesizer generating a local oscillation (LO) signal or an LO generation block is required in a system for transmitting/receiving wireless data, such as a mobile phone, a digital multimedia broadcasting (DMB) phone, and a personal digital assistant (PDA). In this instance, an LO signal is required in a mixer of a transceiver to up/down-convert a frequency of a transmitted/received signal. As an example, a frequency synthesizer is utilized to down-convert a received RF signal into a baseband signal or to up-convert a baseband signal into a carrier signal, in a Code Division Multiple Access (CDMA) system, a global positioning system (GPS), a personal communication system (PCS), an International Mobile Telecommunication (IMT) 2000 system, Wireless Broadband Internet (WiBro) system, a wireless local area network (WLAN) system, an Ultra Wideband (UWB) system, and a WiMax system for a ubiquitous system.

Figure 1:
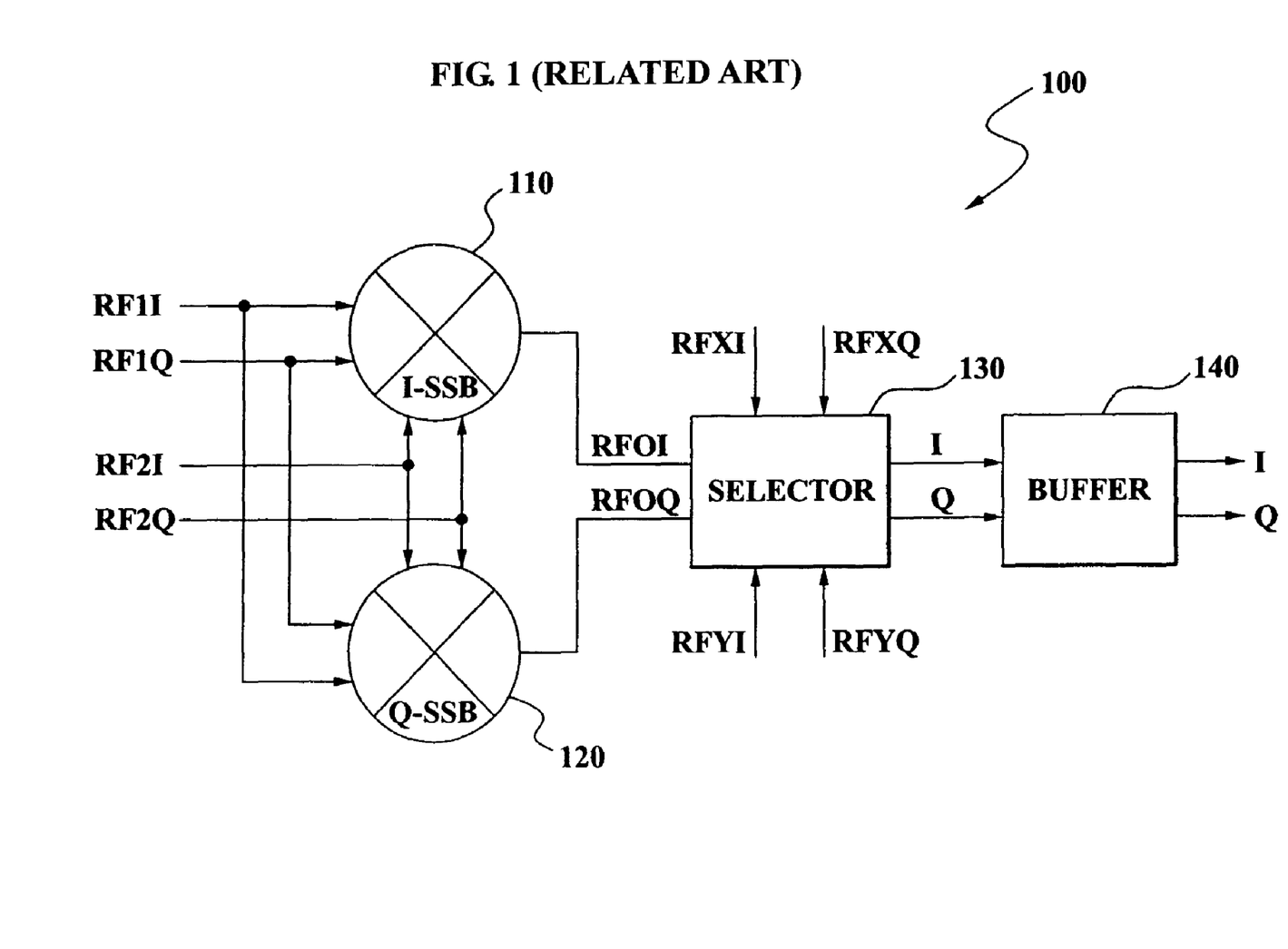
FIG. 1 is a diagram illustrating a related art frequency synthesizer generating a two-phase high frequency signal.

FIG. 1 is a diagram illustrating a related frequency synthesizer 100 generating two high frequency signals having a different phase from each other. Referring to FIG. 1, the frequency synthesizer 100 includes two single side band (SSB) mixers 110 and 120, a selector 130 and a buffer 140.

Each of the two SSB mixers 110 and 120 receives a first high frequency signal RF1I and a second high frequency signal RF2I and quadrature-phase (Q) signals thereof, RF1Q and RF2Q. Also, each of the two SSB mixers 110 and 120 generates an SSB signal RFOI/RFOQ, whose frequency is an addition of frequencies of the two received signals or a difference therebetween, and which have a 90 degree phase difference from each other. In this instance, a Q signal is a signal having a 90 degree phase difference from an in-phase (I) signal.

The selector 130 selects and outputs the SSB signals RFOI and RFOQ, another high frequency signals RFXI and RFXQ that have a 90 degree phase difference from each other, or yet another high frequency signals RFYI and RFYQ that have a 90 degree phase difference from each other. Depending on an RF system, the high frequency signals RFXI and RFXQ may be the first high frequency signal RF1I and the Q signal thereof, RF1Q, and the high frequency signals RFYI and RFYQ may be the second high frequency signal RF2I and the Q signal RF2Q thereof. Also, other signals having other frequencies that are generated in other mixers, a phase-locked loop (PLL) or a voltage-controlled oscillator (VCO) may be input as the high frequency signals RFXI and RFXQ or the high frequency signals RFYI and RFYQ.

In addition to the SSB mixers 110 and 120, and the selector 130 shown in FIG. 1, a plurality of other SSB mixers and selectors may be utilized for processing a multi-band in a ubiquitous system.

An I signal and a Q signal thereof selected in the selector 130 are generally processed in the buffer 140 and input into a receiver (Rx) mixer or a transmitter (Tx) mixer of an RF transceiver. In this instance, the buffer 140 is a circuit element in the structure of a differential amplifier or an inverter. Also, the buffer 140 sufficiently amplifies an I signal and a Q signal thereof output from the selector 130, or increases a driving power thereof.

As described above, necessary multi-band signals may be generated using a large number of SSB mixers. However, in this case, a required circuit area may be unacceptably increased to accommodate a PLL, a VCO and SSB mixers, and a large amount of power may also be consumed. Also, since a large number of circuits are utilized, the distortion or offset of a signal is increased which makes it difficult to generate a stable signal.

SUMMARY OF THE INVENTION

Exemplary embodiments of the present invention overcome the above disadvantages and other disadvantages not described above.

The present invention provides a frequency synthesizer which can be very efficient in utilizing a circuit area and a power consumption so as to be applicable to a multi-band RF receiver.

The present invention also provides a frequency synthesizing method which follows a frequency of an input signal using an injection-locked quadrature VCO and simultaneously generates a Q signal and is thereby applicable to an Rx mixer or a Tx mixer while not using a buffer.

According to an aspect of the present invention, there is provided an oscillator including: a first oscillator generating a first differential signal set from a differential signal set input via positive and negative input terminals; and a second oscillator generating a second differential signal set by receiving positive and negative signals of a differential signal set injected for frequency locking via positive and negative input terminals respectively, and receiving positive and negative signals of the first differential signal set via other positive and negative input terminals respectively, and cross-outputting positive and negative signals of the second differential signal set to negative and positive input terminals of the first oscillator, wherein the first differential signal set and the second differential signal set follow a frequency of the injected differential signal set, and a relationship between the first differential signal set and the second differential signal set is an in-phase (I) signal and a quadrature-phase (Q) signal of the I signal.

According to another aspect of the present invention, there is provided an oscillator including: a first oscillator generating a first differential signal set from a differential signal set input via positive and negative input terminals; and a second oscillator comprising gate terminals of MOSFETs connected between a load circuit and a current source, as positive and negative input terminals, and generating a second differential signal set by receiving an injection signal via a capacitor connected in series to a gate terminal of a MOSFET for the current source and receiving positive and negative signals of the first differential signal set via the positive and negative input terminals respectively, and cross-outputting positive and negative signals of the second differential signal set to negative and positive input terminals of the first oscillator, wherein the first differential signal set and the second differential signal set have a lower frequency than a frequency of the injection signal, and a relationship between the first differential signal set and the second differential signal set is an I signal and a Q signal of the I signal.

In this instance, the first differential signal set and the second differential signal set are utilized in a receiver mixer or a transmitter mixer without being buffered for a frequency up/down-conversion.

According to still another aspect of the present invention, there is provided a frequency synthesizer including: a mixer generating a frequency synthesized signal whose frequency is a synthesis of a first high frequency and a second high frequency, from an I signal of the first high frequency and a Q signal of the I signal of the first high frequency and an I signal of the second high frequency and a Q signal of the I signal of the second high frequency; a selector selecting any one of the I signal of the first high frequency and the frequency synthesized signal; and an oscillator injected with an output of the selector, and generating a first local signal and a second local signal following a frequency of the injection signal and having a quadrature-phase with each other.

According to yet another aspect of the present invention, there is provided a frequency synthesizer including: a mixer generating a frequency synthesized signal whose frequency is a synthesis of a first high frequency and a second high frequency, from an I signal of the first high frequency and a Q signal of the I signal of the first high frequency and an I signal of the second high frequency and a Q signal of the I signal of the second high frequency; a selector selecting any one of the I signal of the first high frequency and the frequency synthesized signal; and an oscillator injected with an output of the selector, and generating a first local signal and a second local signal having one half a frequency of the injection signal and having a quadrature-phase with each other.

According to another aspect of the present invention, there is provided an oscillation method including: generating a first differential signal set using a differential signal set input via positive and negative input terminals in a first oscillator; receiving positive and negative signals of a differential signal set injected for frequency locking via positive and negative input terminals respectively, receiving positive and negative signals of the first differential signal set via other positive and negative input terminals respectively, and generating a second differential signal set, in a second oscillator; and cross-outputting positive and negative signals of the second differential signal set to positive and negative input terminals of the first oscillator, wherein the first differential signal set and the second differential signal set follow a frequency of the injected differential signal set, and a relationship between the first differential signal set and the second differential signal set is an I signal and a Q signal of the I signal.

BRIEF DESCRIPTION OF THE DRAWINGS

The above and/or other aspects of the present invention will become apparent and more readily appreciated by describing certain exemplary embodiments of the present invention with reference to the accompanying drawings, in which.

DETAILED DESCRIPTION OF EXEMPLARY EMBODIMENTS

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 2:
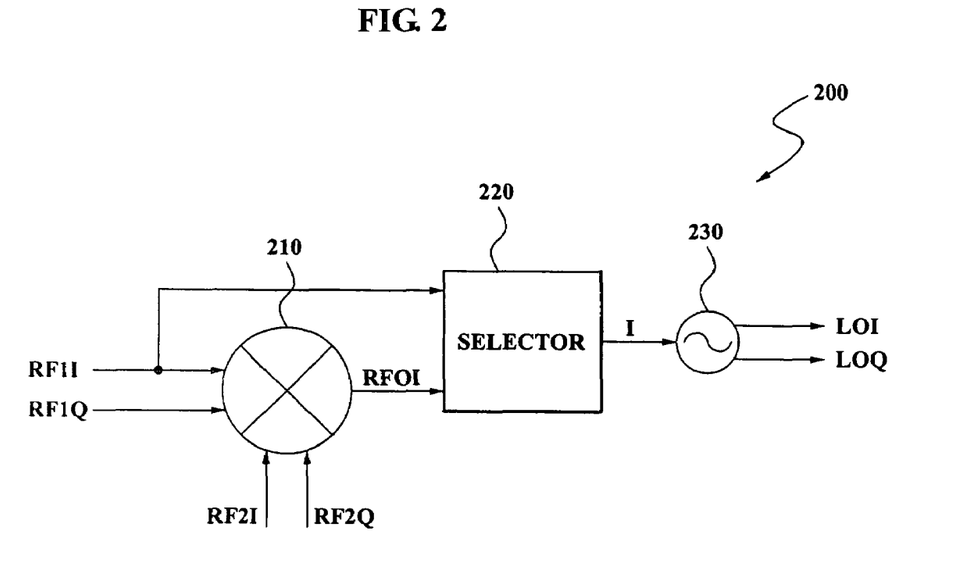
FIG. 2 is a diagram illustrating a frequency synthesizer according to an exemplary embodiment of the present invention.

FIG. 2 is a diagram illustrating a frequency synthesizer 200 according to an exemplary embodiment of the present invention. Referring to FIG. 2, the frequency synthesizer 200 includes an SSB mixer 210, a selector 220, and an injection-locked quadrature VCO 230.

The SSB mixer 210 generates a frequency synthesized signal, i.e., an SSB signal RFOI whose frequency is a synthesis of a first high frequency and a second high frequency, i.e., an addition of frequencies or a difference of frequencies between the first high frequency and the second high frequency. In this instance, the SSB mixer 210 utilizes an I-signal of the first high frequency RF1I and a Q signal RF1Q thereof, and an I signal of the second high frequency RF2I and a Q signal RF2Q thereof. As an example, in a UWB system, when an I signal of a first high frequency RF1I and a Q signal RF1Q thereof are signals having a frequency of 3096 MHz and an I signal of a second high frequency RF2I and a Q signal RF2Q thereof are signals having a frequency of 528 MHz, the SSB mixer 210 generates a signal having a frequency of 4488 or 3432 MHz.

The selector 220 selects and outputs any one of the I signal of the first high frequency RF1I and the frequency synthesized signal RFOI. The conventional frequency synthesizer as shown in FIG. 1 selects an I signal and a Q signal thereof that are output from two SSB mixers, but the selector 220 according to the present embodiment selects only one signal that is generated in the one SSB mixer 210, for example, an RFOI signal, or selects only one signal of the first high frequency, for example, RF1I.

As an example, in FIG. 2, the selector 220 selects one of an input signal RF1I and an output signal of the SSB mixer 210, but the present invention is not limited thereto. Other high frequency signals may be input to the selector 220. In such a case, the selector 220 may select the other high frequency signals. Namely, in an RF receiver enabling a multi-band UWB system, for example, Multi-Band Orthogonal Frequency Division Multiplexing (MB-OFDM) requires a local oscillation signal having various frequencies. For this, other high frequency signals generated in another SSB mixer, a PLL or a VCO may be selected.

The I signal output by the selector 220 is injected into the injection-locked quadrature VCO 230 whereby a first local signal LOI and a second local signal LOQ having a quadrature-phase with each other are generated. In this instance, it was assumed that a signal selected in the selector 220 is injected into the injection-locked quadrature VCO 230, but the present invention is not limited thereto. Namely, an output of the SSB mixer 210 may be directly injected into the injection-locked quadrature VCO 230 as necessary. Also, other high frequency signals generated in another SSB mixer, a PLL or a VCO may be injected into the injection-locked quadrature VCO 230.

Figure 4:
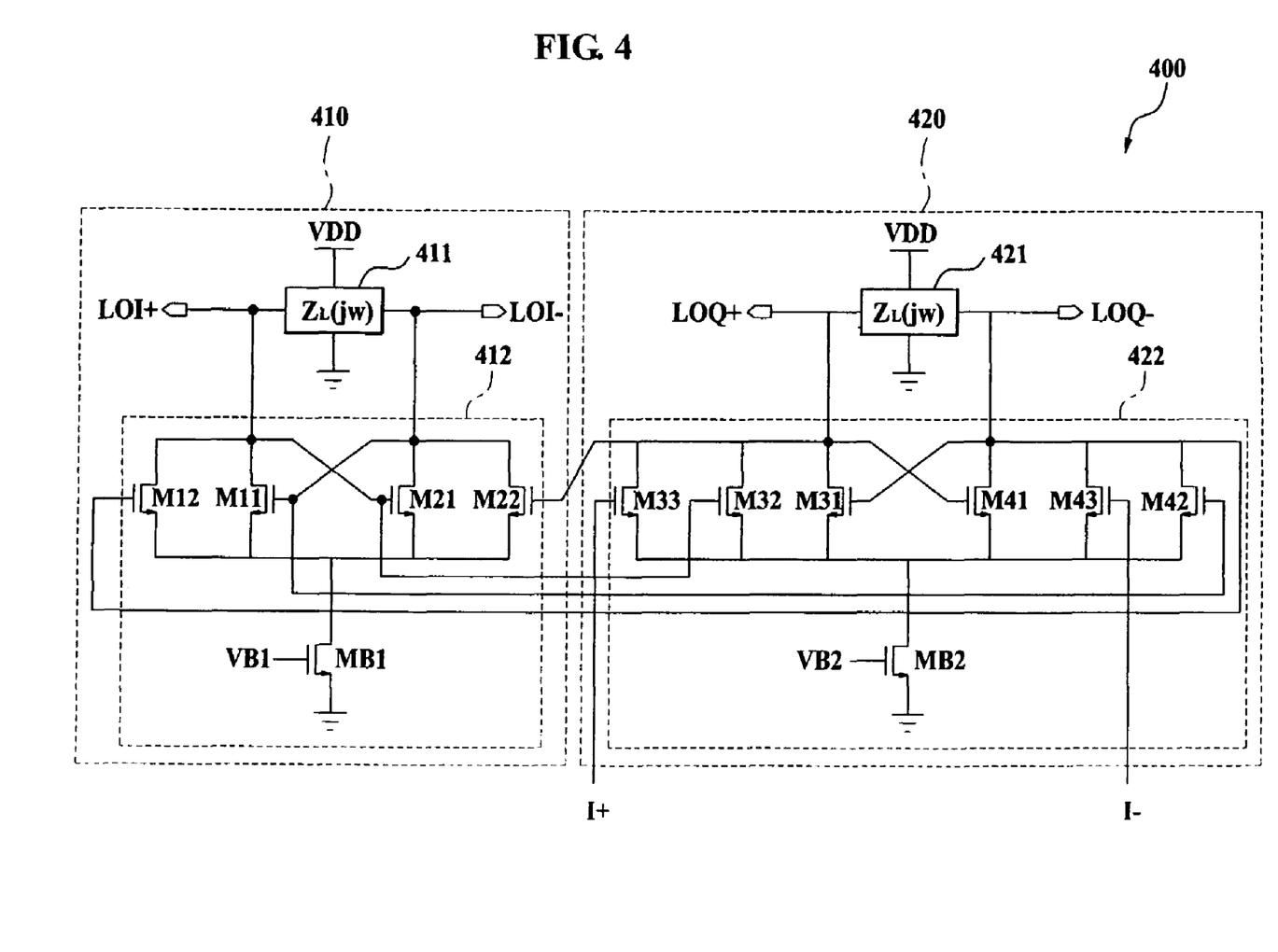
FIG. 4 is a circuit diagram illustrating an exemplary injection-locked quadrature VCO shown with respect to FIG. 3.
Figure 6:
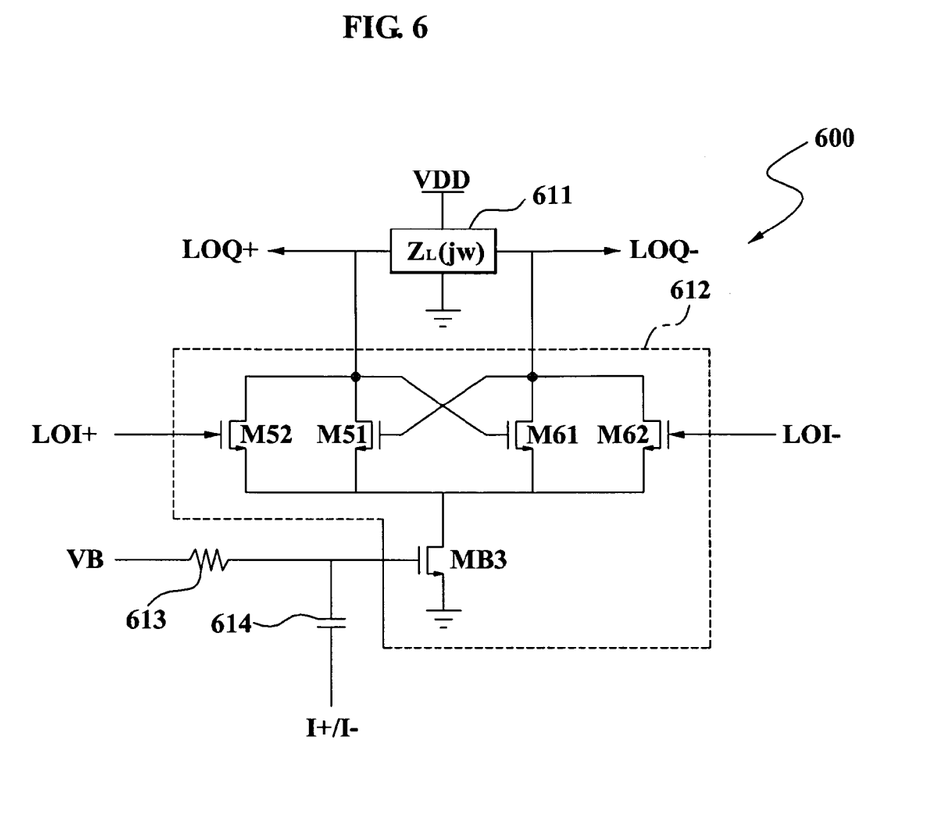
FIG. 6 is a circuit diagram illustrating an exemplary injection-locked frequency divider circuit, as a modification of the circuit shown in FIG. 4.

In this instance, in the injection-locked quadrature VCO 230 according to a circuit configuration shown in FIGS. 4 and 6, a frequency of the first local signal LOI and the second local signal LOQ may have a frequency identical to a frequency of a signal that is injected therein or may have one half the frequency thereof.

As described above, an I signal or a Q signal thereof that is generated in the injection-locked quadrature VCO 230 is generated to have a sufficient driving power in a circuit having a structure of a differential amplifier. Accordingly, the I signal or the Q signal thereof may be utilized in an Rx mixer or a Tx mixer of an RF transceiver without being buffered.

Figure 3:
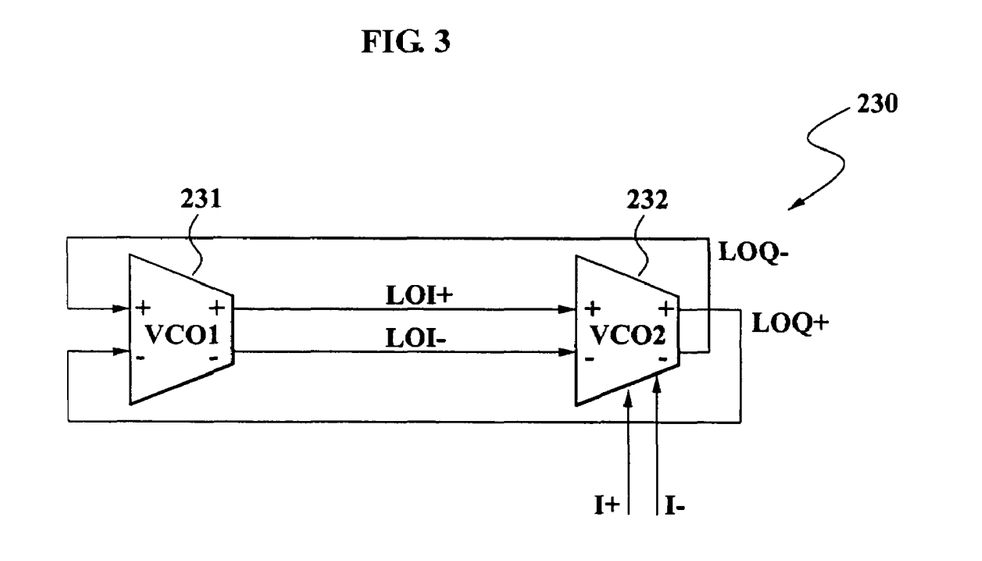
FIG. 3 is a diagram illustrating an exemplary injection-locked quadrature VCO shown in FIG. 2.

FIG. 3 is a diagram exemplarily illustrating the injection-locked quadrature VCO 230. Referring to FIG. 3, the injection-locked quadrature VCO 230 includes a first oscillator 231 and a second oscillator 232.

The first oscillator 231 generates a differential signal set LOI+ and LOI− using a differential signal set LOQ+ and LOQ− from the second oscillator 232 that are input via positive and negative input terminals. Also, the second oscillator 232 receives positive and negative signals I+ and I− of a differential signal set that are injected for frequency locking via positive and negative input terminals respectively and receives positive and negative signals LOI+ and LOI− of the differential signal set from the first oscillator 231 via other positive and negative input terminals respectively. Next, the second oscillator 232 cross-outputs positive and negative signals LOQ+ and LOQ− of the differential signal set that are generated in the second oscillator 232 to the negative and positive input terminals of the first oscillator 231. Namely, the positive signal LOQ+ that is output in the second oscillator 232 is connected to the negative input terminal of the first oscillator 231. Also, the negative signal LOQ− that is output in the second oscillator 232 is connected to the positive input terminal of the first oscillator 231.

In this instance, positive and negative signals are differential signals having a 180 degree phase difference from each other. As an example, one has a 0 degree phase and the other has a 180 degree phase.

Also, signals I+ and I− that are injected into the second oscillator 232 of the injection-locked quadrature VCO 230 may be, for example, a differential signal set that is output from the selector 220 shown FIG. 2. Also, the output set LOI+ and LOI− of the first oscillator 231 and the output set LOQ+ and LOQ− of the second oscillator 232 follow a frequency of the injected differential signal set I+ and I−, and a relationship therebetween is an I signal and a Q signal thereof. Namely, the injection-locked quadrature oscillator 230 simultaneously generates an I signal LOI+/LOI− or a Q signal LOQ+/LOQ− thereof following a frequency of the injected signal I+/I− to have a sufficient driving power. Accordingly, the I signal LOI+/LOI− or the Q signal LOQ+/LOQ− thereof generated in the injection-locked quadrature VCO 230 may be utilized for driving of mixers, for example, a receiver mixer and/or a transmitter mixer, without being buffered.

FIG. 4 is a circuit diagram exemplarily illustrating the injection-locked quadrature VCO 400 shown in FIG. 3. Referring to FIG. 4, the circuit 400 includes a first and a second oscillator 410 and 420 which are in the form of a differential amplifier. In this instance, the first oscillator 410 corresponds to the first oscillator 231 shown in FIG. 3 and the second oscillator 420 corresponds to the second oscillator 232.

The first oscillator 410 includes gate terminals of metal-oxide semiconductor field effect transistors (MOSFETS) M12 and M22, which are coupled between a load circuit 411 and a current source MB1, as the positive and negative input terminals for cross-receiving the differential signal set LOQ+ and LOQ− that is output from the second oscillator 420. In this instance, the load circuit 411 includes inductance components, capacitance components (or varactor) and/or resistance components, and is designed to have a certain impedance $Z_L$. The value(s) of the inductance components and/or the capacitance components is(are) adjustable. The current source MB1 is a simple circuit which makes a current flow according to a bias voltage VB1. In FIG. 4, MOSFETs M11 and M21 receive different output signals LOI+/LOI− from each other via gate terminals and are symmetrically connected to the MOSFETs M12 and M22, so that the output signals LOI+ and LOI− are oscillated.

The second oscillator 420 includes MOSFETs M31 to M33 and M41 to M43 which are coupled between a load circuit 421 and a current source MB2. In this instance, the load circuit 421 includes inductance components, capacitance components(or varactor), and/or resistance components, and is designed to have a certain impedance $Z_L$, which is substantially the same as the load circuit 411. The current source MB2 is a simple circuit which makes a current flow according to a bias voltage VB2.

In FIG. 4, the MOSFETs M31 and M41 receive different output signal LOQ+/LOQ− from each other via gate terminals, so that the output signals LOQ+ and LOQ− are oscillated. Gate terminals of the MOSFETs M33 and M43 are positive and negative input terminals for receiving positive and negative signals I+ and I− of a differential signal set that is injected for frequency locking. Also, gate terminals of the MOSFETs M32 and M42 are positive and negative input terminals for receiving positive and negative signals LOI+ and LOI− of a differential signal set that is output from the first oscillator 410. In this instance, the positive and negative signals LOQ+ and LOQ− of the differential signal set that is generated in the second oscillator 420 are cross-output to the negative and positive input terminals of the first oscillator 410, for example, to gates of the MOSFETs M12 and M22.

As described above, a voltage applied to the capacitance components(or varactor) or a capacitance value of the capacitance components(or varactor) constituting the load circuit 411 of the first oscillator 410 or the load circuit 421 of the second oscillator 420 may be changed by a certain controller. Accordingly, an output frequency may be corrected to be within a certain bandwidth. A difference between the circuit 400 operating as a voltage-controlled oscillator and the conventional art is that the differential signal set LOI+ and LOI− output from the first oscillator 410 has a 90 degree phase difference with the differential signal set LOQ+ and LOQ− output from the second oscillator 420. Also, the differential signal sets LOI+ and LOI−, and LOQ+ and LOQ− follow a frequency of injection signals I+ and I−. Also, the differential signal sets LOI+ and LOI−, and LOQ+ and LOQ− may be generated from the first oscillator 410 and the second oscillator 420 to have a sufficient driving power. Accordingly, the differential signal sets LOI+ and LOI−, and LOQ+ and LOQ− may be utilized in an Rx mixer or a Tx mixer without being buffered.

Figure 5:
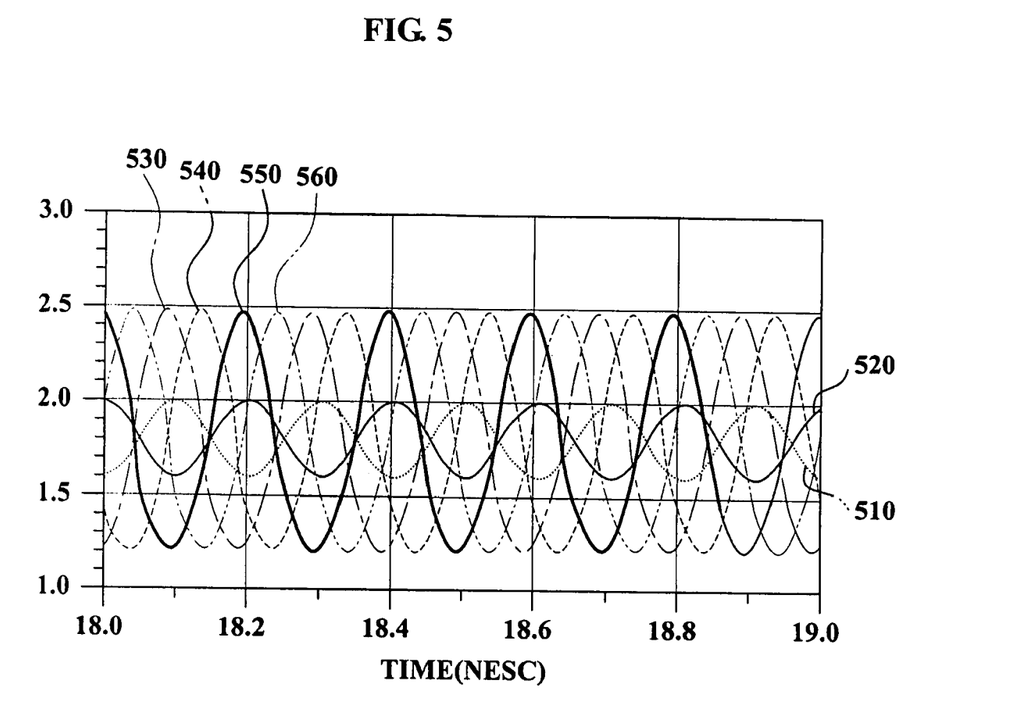
FIG. 5 is a diagram illustrating an example of a waveform showing a relationship between an output signal and an injection signal in an injection-locked quadrature VCO.

As exemplarily shown in FIG. 5, when differential signals 510 and 520 having a frequency of 4488 MHz are injected, the injection signal I+ or I−, into the circuit 400 for the injection-locked quadrature VCO 230, signals 530 and 550 are output as differential signals LOI+ and LOI− that are output from the first oscillator 410. Also, signals 540 and 560 are output as differential signals LOQ+ and LOQ− that are output from the second oscillator 420. In FIG. 5, the differential signals LOI+ and LOI− have a 90 phase difference with the differential signals LOQ+ and LOQ− respectively. Also, the injection signals 510 and 520, and the output signals 530 to 550 have an identical frequency.

FIG. 6 is a diagram illustrating is a circuit diagram exemplarily illustrating a injection-locked frequency divider circuit, as a modification of the circuit shown in FIG. 4. A circuit 600 of FIG. 6 may be utilized for the second oscillator 420 of FIG. 4, so as to add a frequency dividing function. In this instance, it is assumed that a circuit similar to the first oscillator 410 of FIG. 4 is connected in front of the circuit 600 and outputs signals LOI+ and LOI−.

The circuit 600 includes gate terminals of MOSFETs M52 and M62, which are coupled between a load circuit 611 and a MOSFET MB3 for a current source, as positive and negative input terminals. In this instance, the load circuit 611 has a certain impedance $Z_L$ and the current source MB3 receives a bias voltage VB. By the same method described with respect to FIG. 4, the MOSFETs M51 and M61 receive different output signal LOQ+/LOQ− from each other via gate terminals and are symmetrically connected to the MOSFETs M52 and M62, so that output signals LOQ+ and LOQ− are oscillated. In particular, although a signal I+ is received as an injection signal, the present invention is not limited thereto. A signal I− may be received as an injection signal according to a system design. As an example, the signal I+ or I− may be any one signal of a differential signal set that is output from the selector 220 of FIG. 2.

The bias voltage VB that is applied to the MOSFET MB3 for the current source is supplied to a gate terminal of the MOSFET MB3 via a resistor 613. A capacitor 614 is connected in series with the signals I+ and I− to the gate terminal of the MOSFET MB3. The injection signal I+ or I− is supplied to the gate terminal of the MOSFET MB3 via the capacitor 614, together with the bias voltage VB. Namely, the injection signal I+ or I− having a constant frequency is carried in a direct current DC value indicating the bias voltage VB, and supplied to the gate terminal of the MOSFET MB3. In this instance, as a value of the resistor 613 and the capacitor 614 is appropriately selected, the differential signal sets LOI+ and LOI−, and LOQ+ and LOQ− may be controlled to have one half the frequency of the injection signals I+ and I−.

Accordingly, positive and negative signals LOQ+ and LOQ− of the differential signal set that is generated by the circuit 600 may be cross-output to the negative and positive input terminals of the first oscillator 410 of FIG. 4, for example, to the gates of the MOSFETs M12 and M22. Accordingly, the differential signal set LOI+ and LOI− that is output from the first oscillator 410 has a 90 degree phase difference with the differential signal set LOQ+ and LOQ− that is output from the second oscillator 420. Also, the differential signal sets LOI+ and LOI−, and LOQ+ and LOQ− have one half the frequency of the injection signals I+ and I−. In this instance, the differential signal sets LOI+ and LOI−, and LOQ+ and LOQ− may be generated to have a sufficient driving power. Accordingly, the differential signal sets LOI+ and LOI−, and LOQ+ and LOQ− may be utilized in an Rx mixer or a Tx mixer without being buffered.

As described above, in the frequency synthesizer 200 according to an exemplary embodiment of the present invention, an I signal following a frequency of an input high frequency signal and a Q signal thereof are simultaneously generated to have an appropriate driving power by using the injection-locked quadrature VCO 230. Accordingly, the I signal and the Q signal thereof that are generated in the injection-locked quadrature VCO 230 may be utilized as a local signal for frequency up/down-conversion, without being buffered. An output of the SSB mixer 210 may be directly input into the injection-locked quadrature VCO 230. Also, high frequency signals that are generated in another circuit such as the SSB mixer 210, a PLL, or a VCO may be selected to be input into the injection-locked quadrature VCO 230 by the selector 220.

As described above, a frequency synthesizer according to the exemplary embodiment of the present invention utilizes an injection-locked quadrature VCO so as to supply an RF transceiver with a local signal including an I signal and a Q signal thereof. Accordingly, a separate buffer is not needed and a number of SSB mixers may be reduced. Also, multi-frequency local signals that are necessary in a multi-band RF receiver may be supplied using a small circuit area. A high speed operation is possible with a low power consumption and also in a low noise environment. The frequency synthesizer may be applicable to a transceiver in a ubiquitous system, such as a mobile phone, a DMB phone, and a PDA, for transmitting/receiving high speed wireless data, and improve system performance.

The invention can also be embodied as computer readable codes on a computer readable recording medium. The computer readable recording medium is any data storage device that can store data which can be thereafter be read by a computer system. Examples of the computer readable recording medium include read-only memory (ROM), random-access memory (RAM), CD-ROMs, magnetic tapes, floppy disks, optical data storage devices, and carrier waves, such as data transmission through the Internet. The computer readable recording medium can also be distributed over network coupled computer systems so that the computer readable code is stored and executed in a distributed fashion.

Although a few exemplary embodiments of the present invention have been shown and described, the present invention is not limited to the described exemplary embodiments. Instead, it would be appreciated by those ordinarily skilled in the art that changes may be made to these exemplary embodiments without departing from the principles and spirit of the invention, the scope of which is defined by the claims and their equivalents.

What is claimed is:

1. A frequency synthesizer comprising:
    a mixer which generates a frequency synthesized signal whose frequency is a synthesis of first high frequency I and Q signals and second high frequency I and Q signals;
    a selector which selects and outputs one of the I signal of the first high frequency and the frequency synthesized signal; and
    an oscillator which receives an output signal of the selector and generates a first local signal and a second local signal having a quadrature-phase with each other based on the output signal of the selector.

2. The frequency synthesizer of claim 1, wherein each of the first and second local signal has a frequency identical to a frequency of the output signal of the selector.

3. The frequency synthesizer of claim 1, wherein the first and second local signal of the oscillator each has a frequency which is one half a frequency of the output signal of the selector.

4. The frequency synthesizer of claim 1, wherein the frequency synthesized signal is an addition of the first high frequency I and Q signals and the second high frequency I and Q signals.

5. The frequency synthesizer of claim 1, wherein the frequency synthesized signal is a difference between the first high frequency I and Q signals and the second high frequency I and Q signals.

6. The frequency synthesizer of claim 1, wherein the oscillator comprises:
a first oscillator which generates a first differential signal set from a second differential signal set input via first positive and negative input terminals; and
a second oscillator which receives positive and negative signals of a third differential signal set for frequency locking via second positive and negative input terminals, respectively, receives positive and negative signals of the first differential signal set via third positive and negative input terminals, respectively, and generates the second differential signal set based on the positive and negative signals of the third differential signal set and the positive and negative signals of the first differential signal set.

7. The frequency synthesizer of claim 6, wherein the positive signal of the second differential signal is input to the first negative input terminal of the first oscillator, and the negative signal of the second differential signal is input to the first positive input terminal of the first oscillator.

8. The frequency synthesizer of claim 7, wherein:
the first oscillator comprises a plurality of metal-oxide semiconductor field effect transistors (MOSFETs) having gate terminals coupled between a first load circuit and a first current source, as the first positive and negative input terminals, and
the second oscillator comprises a plurality of MOSFETs having gate terminals coupled between second load circuit and second current source, as the second positive and negative input terminals and the third positive and negative input terminals.

9. A frequency synthesizing method comprising:
generating a frequency synthesized signal whose frequency is a synthesis of first high frequency I and Q signals and second high frequency I and Q signals;
selecting one of the first high frequency I signal and the frequency synthesized signal and outputting a selected signal;
inputting the selected signal into an oscillator; and
generating a first local signal and a second local signal having a quadrature-phase with each other based on the selected signal.

10. The frequency synthesizing method of claim 9, wherein each of the first and second local signal has a frequency identical to a frequency of the selected signal.

11. The frequency synthesizing method of claim 9, wherein the first and second local signal each has a frequency which is one half a frequency of the selected signal.

12. The frequency synthesizing method of claim 9, wherein the frequency synthesized signal is an addition of the first high frequency I and Q signals and the second high frequency I and Q signals.

13. The frequency synthesizing method of claim 9, wherein the frequency synthesized signal is a difference between the first high frequency I and Q signals and the second high frequency I and Q signals.

14. The frequency synthesizing method of claim 9, wherein the generating the first local signal and the second local signal comprises:
generating at a first oscillator a first differential signal set using a second differential signal set input via first positive and negative input terminals of the first oscillator;
receiving at a second oscillator positive and negative signals of a third differential signal set for frequency locking via second positive and negative input terminals of the second oscillator, respectively;
receiving at the second oscillator positive and negative signals of the first differential signal set via third positive and negative input terminals of the second oscillator, respectively; and
generating at the second oscillator a second differential signal set.

15. The frequency synthesizing method of claim 14, wherein a positive signal of the second differential signal is input to the first negative input terminal of the first oscillator, and a negative signal of the second differential signal is input to the first positive input terminal of the first oscillator.

* * * * *